United States Patent [19]
Chiou et al.

[11] Patent Number: 5,386,328
[45] Date of Patent: Jan. 31, 1995

[54] CURRENT MIRROR BASED WRITE DRIVER

[75] Inventors: Chii-Fa Chiou, Lake Forest, Calif.; Yuji Isobe, Kawasaki, Japan

[73] Assignee: Silicon Systems, Inc., Tustin, Calif.

[21] Appl. No.: 79,326

[22] Filed: Jun. 18, 1993

[51] Int. Cl.⁶ .......................... G11B 5/09; G11B 5/02
[52] U.S. Cl. ........................................ 360/68; 360/67; 360/46
[58] Field of Search ............... 360/46, 67, 68, 61; 330/252, 257; 331/113 R, 117 R

[56] References Cited
U.S. PATENT DOCUMENTS

| | | | |
|---|---|---|---|
| 4,639,794 | 1/1987 | Ferrier | 360/46 |
| 4,821,127 | 4/1989 | Soga et al. | 360/46 X |
| 4,956,720 | 9/1990 | Tomisawa | 358/324 |
| 5,121,369 | 6/1992 | Makansi | 360/66 |
| 5,132,852 | 7/1992 | Price, Jr. | 360/46 |
| 5,168,395 | 12/1992 | Klaassen et al. | 360/46 |
| 5,257,146 | 10/1993 | Price, Jr. | 360/67 |
| 5,287,231 | 2/1994 | Shier et al. | 360/68 |
| 5,291,347 | 3/1994 | Ngo et al. | 360/68 |

*Primary Examiner*—Donald Hajec
*Assistant Examiner*—Thien Minh Le
*Attorney, Agent, or Firm*—Hecker & Harriman

[57] ABSTRACT

A write driver to operate inductive heads for magnetic recording is disclosed. The inductive recording head is coupled between first and second outputs of a first write driver block. The first and second outputs of the first write driver block are coupled to first and second inputs of a second write driver block, respectively. First and second current sources are coupled to third and fourth inputs of the second write driver block, respectively. A first switching block is coupled to the first current source and to the third input of the second write driver block. A second switching block is coupled to the second current source and to the fourth input of the second write driver block. A first input signal is provided to a first input of the first write driver block and to the first switching block. A second input signal is provided to a second input of the first write driver block and to the second switching block. The second output of the first write driver block, the inductive recording head and the first input of the second write driver block form a first current path when the first input signal is greater than the second input signal. Conversely, the first output of the first write driver block, the inductive recording head and the second input of the second write driver block form a second current path when the second input signal is greater. The first and second input signals may be CMOS or differential ECL signals.

28 Claims, 6 Drawing Sheets

CURRENT MIRROR BASED WRITE DRIVER

BACKGROUND OF THE INVENTION

1. Field of the Invention

The present invention is related to the field of write drivers used to operate inductive recording heads for magnetic recording.

2. Background Art

The present invention is a (HDD) two-terminal inductive head write driver having a head voltage that swings between the upper and lower supply voltage rails. A two-terminal inductive head write driver having a rail-to-rail head voltage swing is particularly useful for recording mechanisms (read/write) that are powered by lower supply voltage sources (i.e., 3.3 V). Because of this capability, a 3.3 V write driver maintains the same performance characteristics as magnetic recording devices that are powered at supply voltage levels of 5 V and 12 V.

FIG. 1 is a detailed diagram of a typical prior art circuit for implementing a write driver comprising four NPN transistors Q101-Q104, an inductive load, $L_{HEAD}$, Schottky NPN transistors Q105-Q106, a bandgap voltage reference, $V_{BG}$, and operational amplifier, OP1. A first transistor pair Q101 and Q102 are coupled in parallel having a common collector that is coupled to supply voltage, $V_{CC}$. Inductive load, $L_{HEAD}$, is coupled between the emitters of transistors Q101 and Q102. The emitters of transistors Q101 and Q102 are also coupled to the collectors of transistors Q103 and Q104, respectively. The second transistor pair Q103 and Q104 are coupled in parallel having a common emitter that is coupled to the first terminal of resistor $R_{WC}$ and the inverting input of operational amplifier OP1. The second terminal of resistor $R_{WC}$ is coupled to ground.

Bandgap voltage reference $V_{BG}$ is coupled between ground and the non-inverting input of operational amplifier OP1. The output of operational amplifier OP1 is coupled to the first terminals of resistors R103 and R104. The second terminal of resistor R103 is coupled to the anode of Schottky diode D101 and the base of Schottky transistor Q105. A first input voltage $V_{DX}$ is provided to the cathode of Schottky diode D101. Similarly, the second terminal of resistor R104 is coupled to the anode of Schottky diode D102 and the base of Schottky transistor Q106. Also, a second input voltage $V_{DY}$ is provided to the cathode of Schottky diode D102. Schottky transistors Q105 and Q106 are coupled in parallel having a common emitter that is coupled a first terminal of constant current source I101. The second terminal of constant current source I101 is coupled to ground. The collector of Schottky transistor Q105 is coupled to a first terminal of resistor R101 and the base of transistor Q101. The second terminal of resistor R101 is coupled to supply voltage $V_{CC}$. Similarly, the collector of Schottky transistor Q106 is coupled to a first terminal of resistor R102 and the base of transistor Q102. Also, the second terminal of resistor R102 is coupled to supply voltage $V_{CC}$.

Bandgap voltage reference $V_{BG}$ provides a voltage to the non-inverting input of operational amplifier OP1 that is equal to the bandgap voltage of silicon (1.25 V). Thus, the voltage $V_{WC}$ across resistor $R_{WC}$ is forced to the bandgap voltage of 1.25 V by operational amplifier OP1. The output of operational amplifier OP1 is coupled in a feedback loop through transistors Q103 and Q104 to the inverting input of operational amplifier OP1.

Voltages $V_{DX}$ and $V_{DY}$ are differential logic signals. When voltage $V_{DX}$ is greater than voltage $V_{DY}$, transistors Q103 and Q105 are turned on, whereas, transistors Q104 and Q106 are turned off. Because transistor Q106 is off and transistor Q105 is on, the current $I_{Q5}$ flowing through transistor Q105 is equal to the current through constant current source I1 and the current through transistor Q106 is zero. The voltage drop across resistor R101 due to current $I_{Q5}$ turns transistor Q101 off, while the voltage at the base of transistor Q102 (approximately supply voltage $V_{CC}$) turns on transistor Q102. Since transistors Q102 and Q103 are on and transistors Q101 and Q104 are off, a current (equal to $V_{BG}/R_{WC}$) is steered from the supply voltage toward ground through a conduction path comprising transistor Q102, inductive load, $L_{HEAD}$, and transistor Q103.

When voltage $V_{DX}$ is lower than voltage $V_{DY}$, transistors Q104 and Q106 are turned on, whereas, transistors Q103 and Q105 are turned off. Since transistor Q105 is off and transistor Q106 is on, the current $I_{Q6}$ flowing through transistor Q106 is equal to the current through constant current source I101 and the current through transistor Q105 is zero. Thus, the voltage drop across resistor R102 due to current $I_{Q6}$ turns transistor Q102 off, while the voltage at the base of transistor Q101 (approximately supply voltage $V_{CC}$) turns on transistor Q101. Since transistors Q101 and Q104 are on and transistors Q102 and Q103 are off, a current (equal to $V_{BG}/R_{WC}$) is steered from the supply voltage toward ground through a conduction path comprising transistor Q101, inductive load, $L_{HEAD}$, and transistor Q104.

During the write current transition, current paths are switched and the current rise time, $t_r$, and the current fall time, $t_f$, are given by the following equation:

$$t_r = t_f = L_h * \Delta I_h / V_h, \quad (1)$$

where $L_h$ is the head inductance, $\Delta I_h$ is the change in head current and $V_h$ is the head voltage swing. Equation (1) shows that the rise time and the fall time for the current transition of the write driver are inversely proportional to the head voltage swing, $V_h$. Therefore, increasing the head voltage swing results in a faster rise and fall time for high speed magnetic recording.

Using Kirchhoff's voltage law, the voltage swing across the head mechanism, $L_{HEAD}$, can be determined from FIG. 1. The write driver circuit illustrated in FIG. 1 is a symmetrical circuit having matched components, therefore the head voltage swing for the current path comprising transistors Q102-Q103 is equal to the voltage swing for the current path comprising transistors Q101-Q104. The head swing voltage is given by the following equation:

$$V_h(\text{peak}) = V_{CC} - (V_{BE} + V_{WC} + V_{CE}), \quad (2)$$

where $V_h(\text{peak})$ is the peak head voltage swing, $V_{CC}$ is the supply voltage, $V_{BE}$ is the forward biased base-emitter voltage of transistors Q101-Q102, $V_{WC}$ is the voltage across resistor $R_{WC}$, and $V_{CE}$ is the collector-emitter voltage of transistor Q103-Q104. Equation (2) shows that the write driver circuit of FIG. 1 only provides about 1 V peak head swing voltage at 3.3 V supply voltage operation. Thus, the prior art has the disadvantage that at 3.3 V it only provides less than half the head swing voltage of a write driver operating at 5 V.

SUMMARY OF THE PRESENT INVENTION

The present invention is related to the field of write drivers used to operate inductive recording heads for magnetic recording. In particular, a two-terminal inductive head write driver is disclosed having a head voltage that swings between the upper and lower supply voltage rails. The 3.3 V write driver maintains the same performance characteristics as magnetic recording devices that are powered at supply voltage levels of 5 V and 12 V.

The present invention is a circuit for operating inductive recording heads including a first and second write driver block. An inductive recording head for magnetically recording data is coupled between first and second outputs of a first write driver block. The first and second outputs of the first write driver block are coupled to first and second inputs of a second write driver block, respectively. The inductive recording head is also coupled between the first and second inputs of the second write driver block. First and second current sources are coupled to third and fourth inputs of the second write driver block, respectively. A first switching block is coupled to the first current source and to the third input of the second write driver block. A second switching block is coupled to the second current source and to the fourth input of the second write driver block.

A first input signal is provided to a first input of the first write driver block and to the first switching block. A second input signal is provided to a second input of the first write driver block and to the second switching block. The second output of the first write driver block, the inductive recording head and the first input of the second write driver block from a first current path when the first input signal is greater than the second input signal. Conversely, the first output of the first write driver block, the inductive recording head and the second input of the second write driver block form a second current path when the second input signal is greater than the first input signal. The first and second input signals may be CMOS or differential ECL/CML level signals.

In an alternate embodiment of the present invention, a write driver is modified for handling differential input signals. The circuit allows connection to positive Emitter Coupled Logic (ECL) with proper level shifting. Basic construction for the write driver is similar to the preferred embodiment and the first alternate embodiment. The circuit differs from the two other embodiments in regards to the input signal levels and in the construction of the switching circuitry.

For a supply voltage of 3.3 V, a head voltage swing of approximately 2.7 V is obtained. The write driver provides a head swing voltage that is larger than prior art write drivers powered by 3.3 V voltage supplies. Thus, the present invention provides read/write mechanisms operating at 3.3 V with same performance as devices operated with 5 V and 12 V voltage supplies.

DETAILED DESCRIPTION OF THE PRESENT INVENTION

A write driver powered by a 3.3 V supply voltage is described. In the following description, numerous specific details, such as number and nature of external signals, transistors, etc., are described in detail in order to provide a more thorough description of the present invention. It will be apparent, however, to one skilled in the art, that the present invention may be practiced without these specific details. In other instances, well-known features have not been described in detail so as not to unnecessarily obscure the present invention.

The present invention is related to the field of write drivers used to operate inductive recording heads for magnetic recording. In particular, a two-terminal inductive head write driver is disclosed having a head voltage that swings between the upper and lower supply voltage rails. The 3.3 V write driver maintains the same performance characteristics as magnetic recording devices that are powered at supply voltage levels of 5 V and 12 V.

The present invention is a circuit for operating inductive recording heads including a first and second write driver block. An inductive recording head for magnetically recording data is coupled between first and second outputs of a first write driver block. The first and second outputs of the first write driver block are also coupled to first and second inputs of a second write driver block, respectively. A first switching block is coupled to the first current source and to the third input of a second write driver block. A second switching block is coupled to a second current source and to the fourth input of the second write driver block.

A first input signal is provided to a first input of the first write driver block and to the first switching block. A second input signal is provided to a second input of the first write driver block and to the second switching block. The first and second input signals are used to steer current through the inductive recording head, and may be CMOS or differential ECL/CML level signals. The second output of the first write driver block, the inductive recording head and the first input of the second write driver block form a first current path when the first input signal is greater than the second input signal. Conversely, the first output of the first write driver block, the inductive recording head and the second input of the second write driver block form a second current path when the second input signal is greater than the first input signal.

Figure 1:
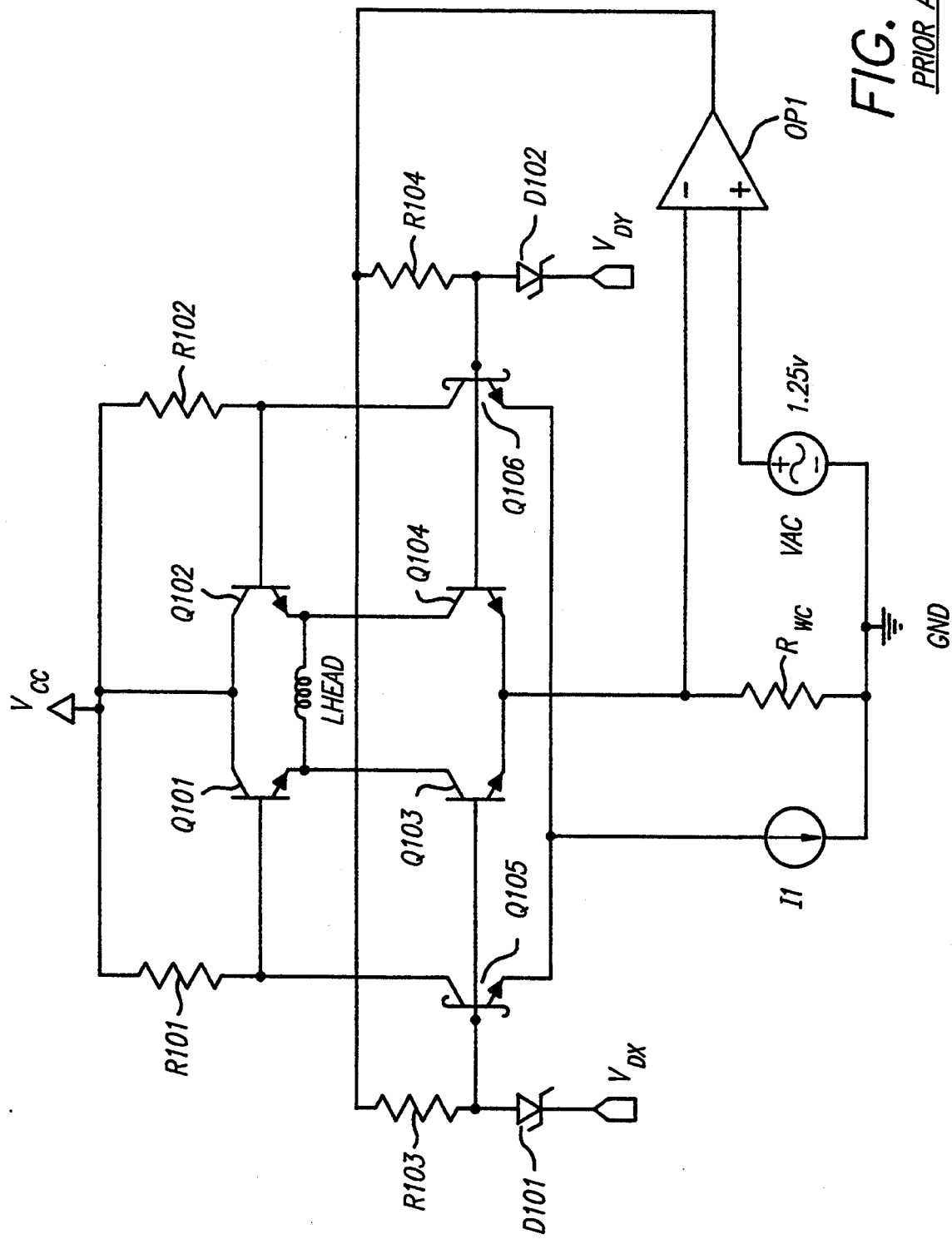
FIG. 1 is a detailed diagram of a prior art circuit for implementing a write driver powered by a 3.3 V supply voltage.
Figure 2:
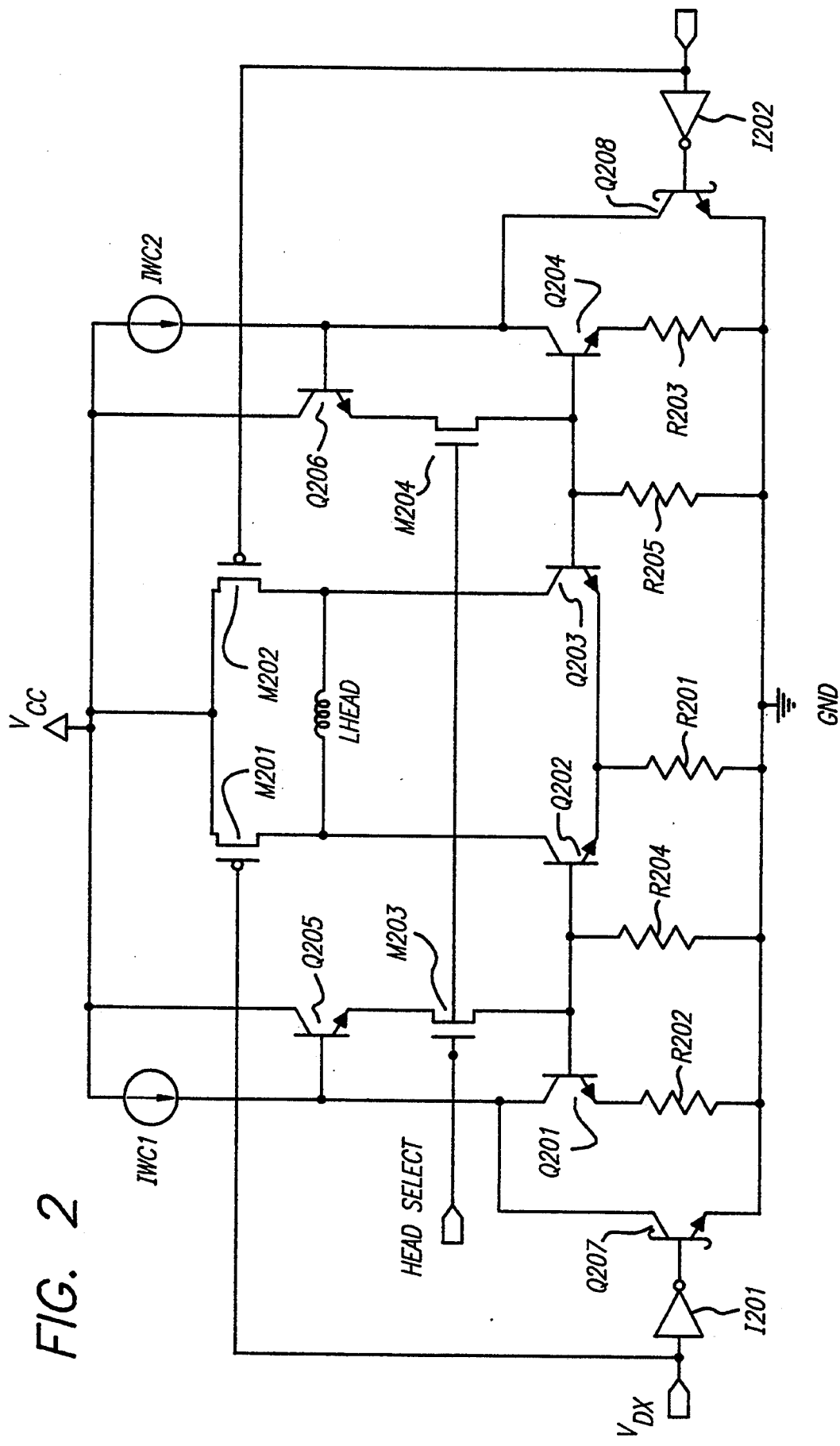
FIG. 2 is a detailed diagram of the preferred embodiment of the present invention.

FIG. 2 is a detailed diagram illustrating the preferred embodiment of the present invention comprising NPN transistors Q201–Q206, Schottky transistors Q207–Q208, FETs M201–M204, constant current sources $I_{WC1}$ and $I_{WC2}$, and inverters I201–I202. A first transistor pair Q202 and Q203 are coupled in parallel having a common emitter coupled to the first terminal of resistor R201. The second terminal of resistor R201 is coupled to ground. The collector of transistor Q202 is coupled to drain of PMOS FET M201 and a first terminal of inductive head, $L_{HEAD}$. Similarly, the collector of transistor Q203 is coupled to drain of PMOS FET M202 and a second terminal of inductive head, $L_{HEAD}$. PMOS FETs M201 and M202 are coupled in parallel having a common source that is coupled to supply voltage $V_{CC}$.

Voltage supply $V_{CC}$ is coupled to the collectors of NPN transistors Q205 and Q206 and to the first terminals of constant current sources $I_{WC1}$ and $I_{WC2}$. The second terminal of constant current source $I_{WC1}$ is coupled to the collectors of NPN transistor Q201 and Schottky transistor Q207 and to the base of NPN transistor Q205. The emitter of Schottky transistor Q207 is coupled to ground. A first terminal of resistor R202 is coupled to the emitter of transistor Q201 and the second terminal of resistor R202 is coupled to ground. Similarly, the second terminal of constant current source $I_{WC2}$ is coupled to the collectors of NPN transistor Q204 and Schottky transistor Q208 and to the base of NPN transistor Q206. The emitter of Schottky transistor Q208 is coupled to ground. A first terminal of resistor R203 is coupled to the emitter of transistor Q204 and the second terminal of resistor R203 is coupled to ground.

The emitters of transistors Q205 and Q206 are coupled to the drains of NMOS FETs M203 and M204, respectively. Control signal HEAD_SELECT is provided to the gates of FETs M203 and M204. The source of FET M203 is coupled to the bases of transistors Q201 and Q202 and to the first terminal of resistor R204. The second terminal of resistor R204 is coupled to ground. Similarly, the source of FET M204 is coupled to the bases of transistors Q203 and Q204 and to the first terminal of resistor R205. The second terminal of resistor R205 is coupled to ground. A first input voltage $V_{DX}$ is coupled to the gate of PMOS FET M201 and to the input of inverter I201. The output of inverter I201 is coupled to the base of Schottky transistor Q207. Similarly, a second input voltage $V_{DY}$ is coupled to the gate of PMOS FET M202 and to the input of inverter I202. The output of inverter I202 is coupled to the base of Schottky transistor Q208.

In FIG. 2, the upper write driver comprises M201–M202, while the lower write driver comprises NPN transistors Q201–Q204 and resistors R201–R205. The lower write driver implements both the current mirror and write driver functions. The input signals $V_{DX}$ and $V_{DY}$ are CMOS logic compatible. In the following discussion, control signal HEAD_SELECT is assumed to be high, thereby turning on NMOS FETs M203–M204. When $V_{DX}$ is high and $V_{DY}$ is low, PMOS FET M201 is turned off while PMOS FET M202 is turned on. The output of inverter I201 is low, thereby turning off Schottky transistor Q207, whereas, the output of inverter I202 turns on Schottky transistor Q208. Turning on Schottky transistor Q208 shunts the collector of NPN transistor Q204 to ground, thereby turning off NPN transistor Q206. Because transistor Q206 is turned off, the current through resistor R205 and into the bases of transistors Q203–Q204 is zero. Thus, the bases of transistors Q203 and Q204 are pulled to ground, thereby turning off transistor Q203. Because Schottky transistor Q207 is turned off, constant current source $I_{WC1}$ produces a voltage equal to $I_{WC1}*R201+V_{BE}$ at the base of transistor Q202. Transistor Q205 provides current to the base of transistor Q202, thereby turning on transistor Q202. Thus, transistor Q202 sinks a current that flows from PMOS FET M202 through inductive head, $L_{HEAD}$.

Similarly, when input voltage $V_{DY}$ is high and $V_{DX}$ is low, PMOS FET M201 is turned on, while FET M202 is turned off. Schottky transistor Q207 is turned on because of inverter I201 which turns off NPN transistor Q202. Schottky transistor Q208 is turned off, thereby turning on transistor Q203. Thus, NPN transistor Q203 sinks a current that flows from PMOS FET M201 through inductive head, $L_{HEAD}$, when $V_{DY}$ is high and $V_{DX}$ is low.

Constant current $I_{WC1}$ and $I_{WC2}$ are bandgap-referenced currents equal to $V_{BG}$ divided by resistance $R_{WC}$ of the prior art. Bandgap-referenced write current $I_{WC}$ is used to drive inductive head $L_{HEAD}$. The head current $I_h$ is proportional to $I_{WC1}$ and $I_{WC2}$.

For the write driver illustrated in FIG. 2 and assuming FET M201 and transistor Q203 are on, the head voltage swing, $V_h$(peak), is determined using Kirchhoff's voltage law as follows:

$$V_h(\text{peak}) = V_{CC} - (I_h*(R_{ON}+R201) + V_{CE}(\text{sat})), \quad (3)$$

where $V_{CC}$ is the supply voltage, $I_h$ is the head current, $R_{ON}$ is the on resistance of PMOS FET M201, and $V_{CE}$(sat) is the collector-emitter saturation voltage of transistor Q203. Equation (3) also expresses the head voltage swing for the current path comprising PMOS FET M202 and NPN transistor Q202 since the write driver of FIG. 2 is a symmetric circuit having matched components. The on resistance $R_{ON}$ of PMOS FETs M201–M202 is proportional to the ratio of gate width and length for the PMOS FET device geometry. By selecting reasonable dimensions for the PMOS FET device geometry, $R_{ON}$ is set to 10 Ω or less. Further, resistor R201 is set to have a resistance value of 5 to 10 Ω. Assuming supply voltage $V_{CC}$=3.3 V, head current $I_h$=20 mA and saturation voltage $V_{CE}$(sat)=0.3 V, a head voltage swing of approximately 2.7 V is determined using Equation (3). The write driver illustrated in FIG. 2 provides a head swing voltage that is larger than prior art write drivers powered by 3.3 V voltage supplies. Thus, the present invention provides read/write mechanisms operating at 3.3 V with same performance as devices operated with 5 V and 12 V voltage supplies.

Figure 3:
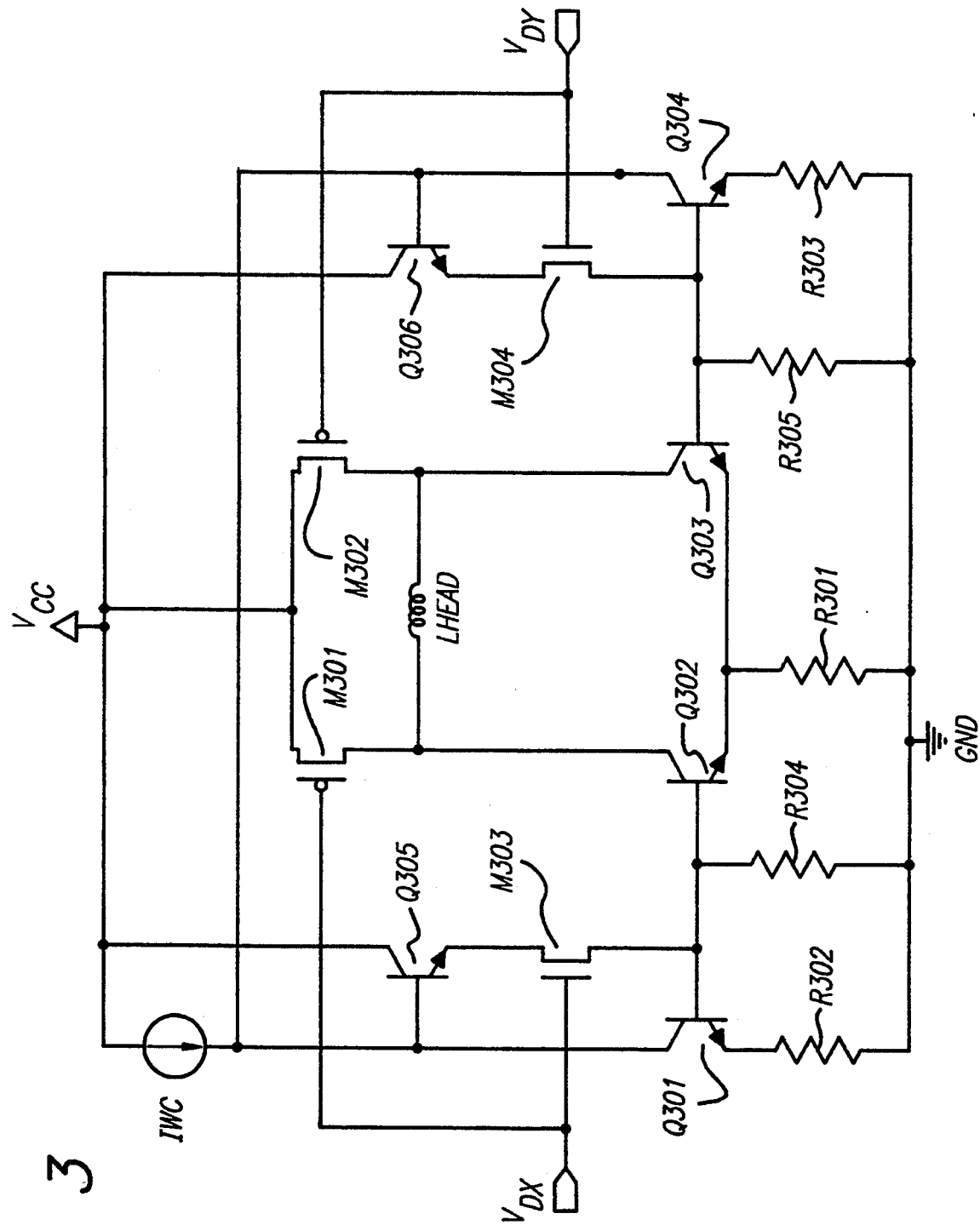
FIG. 3 is a detailed diagram of an alternate embodiment of the present invention.

An alternate embodiment of the present invention is illustrated in FIG. 3 comprising PMOS FETs M301–M302, NPN transistors Q301–Q306, NMOS FETs M303–M304, and constant current source $I_{WC}$. A first transistor pair Q302 and Q303 are coupled in parallel having a common emitter coupled to the first terminal of resistor R301. The second terminal of resistor R301 is coupled to ground. The collector of transistor Q302 is coupled to drain of PMOS FET M301 and a first terminal of inductive load, $L_{HEAD}$. Similarly, the collector of transistor Q303 is coupled to drain of PMOS FET M302 and a second terminal of inductive head, $L_{HEAD}$. PMOS FETs M301 and M302 are coupled in parallel having a common source that is coupled to supply voltage $V_{CC}$.

Voltage supply $V_{CC}$ is coupled to the collectors of NPN transistors Q305 and Q306 and to a first terminal of constant current source $I_{WC}$. The second terminal of constant current source $I_{WC}$ is coupled to the collectors of NPN transistors Q301 and Q304, and to the bases of NPN transistors Q305 and Q306. Resistors R302 and R303 are coupled between ground and the emitters of transistors Q301 and Q304, respectively. The emitters of transistors Q305 and Q306 are coupled to the drains of NMOS FETs M303 and M304, respectively. Input signal $V_{DX}$ is provided to the gates of PMOS FET M303 and NMOS FET M301. Input signal $V_{DY}$ is provided to the gates of PMOS FET M304 and NMOS FET M302. The source of FET M303 is coupled to the bases of transistors Q301 and Q302 and to the first terminal of resistor R304. The second terminal of resistor R304 is coupled to ground. Similarly, the source of FET M304 is coupled to the bases of transistors Q303 and Q304 and to the first terminal of resistor R305. The second terminal of resistor R305 is coupled to ground.

When input voltage $V_{DX}$ is high and $V_{DY}$ is low, PMOS FET M301 and NMOS FET M304 are turned off, while PMOS FET M302 and NMOS FET M303 are turned on. Since NMOS FET M304 is turned off, NPN transistor Q303 is turned off. However, NMOS FET M303 is turned on due to $V_{DX}$, therefore NPN transistor Q302 is turned on and sinks a current that flows from PMOS FET M302 through inductive load, $L_{HEAD}$. Thus, current mirror Q301-Q302 is active and sinks a current through the inductive load.

When input voltage $V_{DY}$ is high and $V_{DX}$ is low, PMOS FET M302 and NMOS FET M303 are turned off, while PMOS FET M301 and NMOS FET M304 are turned on. Because NMOS FET M303 is turned off, NPN transistor Q302 is turned off. However, NMOS FET M304 is turned on due to $V_{DY}$, therefore NPN transistor Q303 is turned on and sinks a current that flows from PMOS FET M301 through inductive load, $L_{HEAD}$. Thus, current mirror Q303-Q304 is active and sinks a current through the inductive load.

In FIG. 3, the head voltage swing is determined using Kirchhoff's voltage law along a current path of the write driver. The peak swing voltage across the write head is described by Equation (3), as shown above. Thus, this alternate embodiment provides read/write mechanisms operating at 3.3 V with same performance as devices operated with 5 V and 12 V voltage supplies.

Figure 4:
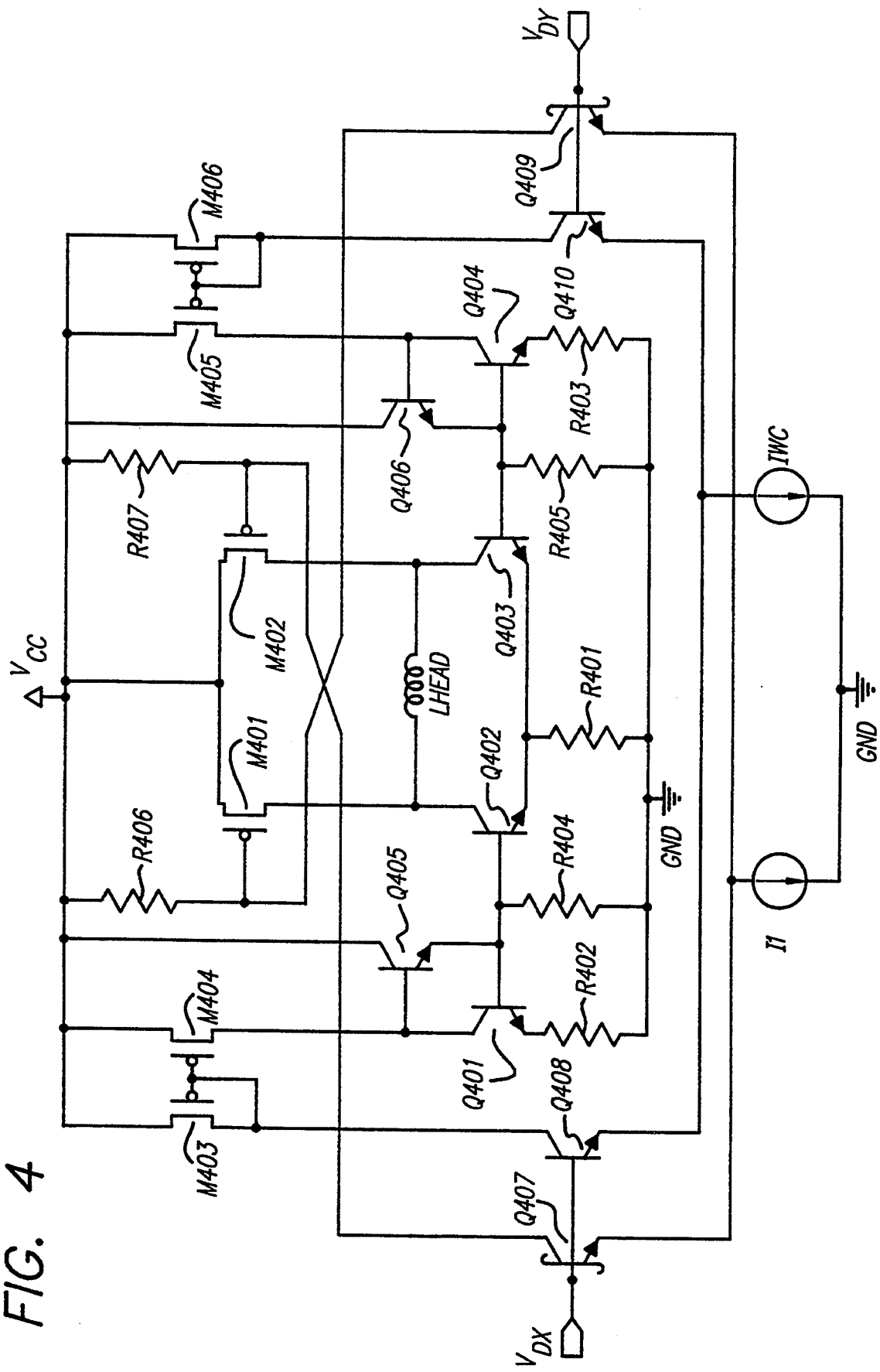
FIG. 4 is a detailed diagram of another alternate embodiment of the present invention.

FIG. 4 is a detailed diagram illustrating another alternate embodiment of the present invention comprising PMOS FETs M401-M406, Schottky transistors Q407 and Q409, NPN transistors Q401-Q406, Q408 and Q410, inductive load $L_{HEAD}$, and constant current sources I1 and $I_{WC}$. Transistors Q402 and Q403 are coupled in parallel having a common emitter that is coupled to a first terminal of resistor R401. The second terminal of resistor R401 is coupled to ground. The collector of transistor Q402 is coupled to the drain of PMOS FET M401 and to a first terminal of inductive load, $L_{HEAD}$. Similarly, the collector of transistor Q403 is coupled to the drain of PMOS FET M402 and to a second terminal of inductive load, $L_{HEAD}$. PMOS FETs M401-M402 are coupled in parallel having a common source coupled supply voltage $V_{CC}$.

Supply voltage $V_{CC}$ is coupled to the sources of PMOS FETs M403-M406, the collectors of NPN transistors Q405-Q406, and first terminals of resistors R406-R407. The second terminal of resistor R406 is coupled to the gate of PMOS FET M401 and the collector of Schottky transistor Q409. Similarly, the second terminal of resistor R407 is coupled to the gate of PMOS FET M402 and the collector of Schottky transistor Q407. Schottky transistors Q407 and Q409 are connected in parallel having a common emitter that is coupled to a first terminal of constant current source I1.

The gate of FET M404 is coupled to the gate and the drain of FET M403. Similarly, the gate of FET M405 is coupled to the gate and the drain of FET M406. The drains of FETs M403 and M406 are coupled to the collectors of NPN transistors Q408 and Q410, respectively. Input voltage $V_{DX}$ is provided to the bases of transistors Q407 and Q408. Input voltage $V_{DY}$ is provided to the bases of transistors Q409 and Q410. Transistors Q408 and Q410 are connected in parallel having a common emitter coupled to a first terminal of constant current source $I_{WC}$. The second terminal of constant current source $I_{WC}$ is coupled to ground.

The drain of PMOS FET M404 is coupled to the base of transistor Q405 and the collector of transistor Q401. A resistor R402 is coupled between the emitter of transistor Q401 and ground. The emitter of transistor Q405 is coupled to the bases of transistors Q401 and Q402 and to a first terminal of resistor R404. The second terminal of resistor R404 is coupled to ground. The drain of PMOS FET M405 is coupled to the base of transistor Q406 and the collector of transistor Q404. A resistor R403 is coupled between the emitter transistor Q404 and ground. The emitter of transistor Q406 is coupled to the bases of transistors Q403 and Q404 and to a first terminal of resistor R405. The second terminal of resistor R405 is coupled to ground.

The write driver illustrated in FIG. 4 is a modification for handling differential input signals $V_{DX}$ and $V_{DY}$. The circuit allows connection to positive Emitter Coupled Logic (ECL) with proper level shifting. Basic construction for the write driver is similar to the preferred embodiment and the first alternate embodiment. The circuit of FIG. 4 differs from the two other embodiments in regards to the input signal levels and in the construction of the switching circuitry.

When input signal $V_{DX}$ is greater than $V_{DY}$, transistors Q407 and Q408 are turned on, whereas transistors Q409 and Q410 are turned off. Because transistor Q407 is turned on while transistor 0.409 is turned off, constant current source I1 is switched through Q407, thereby producing a voltage drop across resistor R407 only. The voltage at the gate of FET M401 is equal to supply voltage $V_{CC}$. Thus, FET M401 is turned off while FET M402 is turned on. Further, transistor Q408 is turned on, whereas, transistor Q410 is turned off. Therefore, constant current source $I_{WC}$ sinks a current through FET 403 while the current through FET M406 is zero. Because the current through FET M406 is zero, the current mirror comprising FETs M405-M406 does not provide current to write current mirror Q403-Q404. Therefore, transistor Q403 is turned off. However, current mirror M403-M404 provides current to write current mirror Q401-Q402. Thus, transistor Q401 is turned on and sinks a head current that flows from FET M402 through inductive load, $L_{HEAD}$. The current through Q402 is proportional to constant current $I_{WC}$.

When input signal $V_{DY}$ is greater than $V_{DX}$, transistors Q409 and Q410 are turned on, whereas transistors Q407 and Q408 are turned off. Because transistor Q409 is turned on while transistor Q407 is turned off, constant current source I1 is switched through Q409, thereby producing a voltage drop across resistor R406 only. The voltage at the gate of FET M402 is equal to supply voltage $V_{CC}$. Thus, FET M402 is turned off while FET M401 is turned on. Further, transistor Q410 is turned on, whereas, transistor Q408 is turned off. Therefore, constant current source $I_{WC}$ sinks a current through FET M406 while the current through FET M403 is zero. Because the current through FET M403 is zero, the current mirror comprising FETs M403-M404 does not provide current to write current mirror Q401-Q402. Therefore, transistor Q402 is turned off. However, current mirror M405-M406 provides current to write current mirror Q403–Q404. Thus, transistor Q403 is turned on and sinks a head current that flows from FET M401 through inductive load, $L_{HEAD}$. The current through Q403 is proportional to constant current $I_{WC}$.

In FIG. 4, the head voltage swing is determined using Kirchhoff's voltage law along a current path of the write driver. The peak swing voltage across the write head is described by Equation (3), as shown above. Thus, this embodiment provides read/write mechanisms operating at 3.3 V with same performance as devices operated with 5 V and 12 V voltage supplies.

Figure 5:
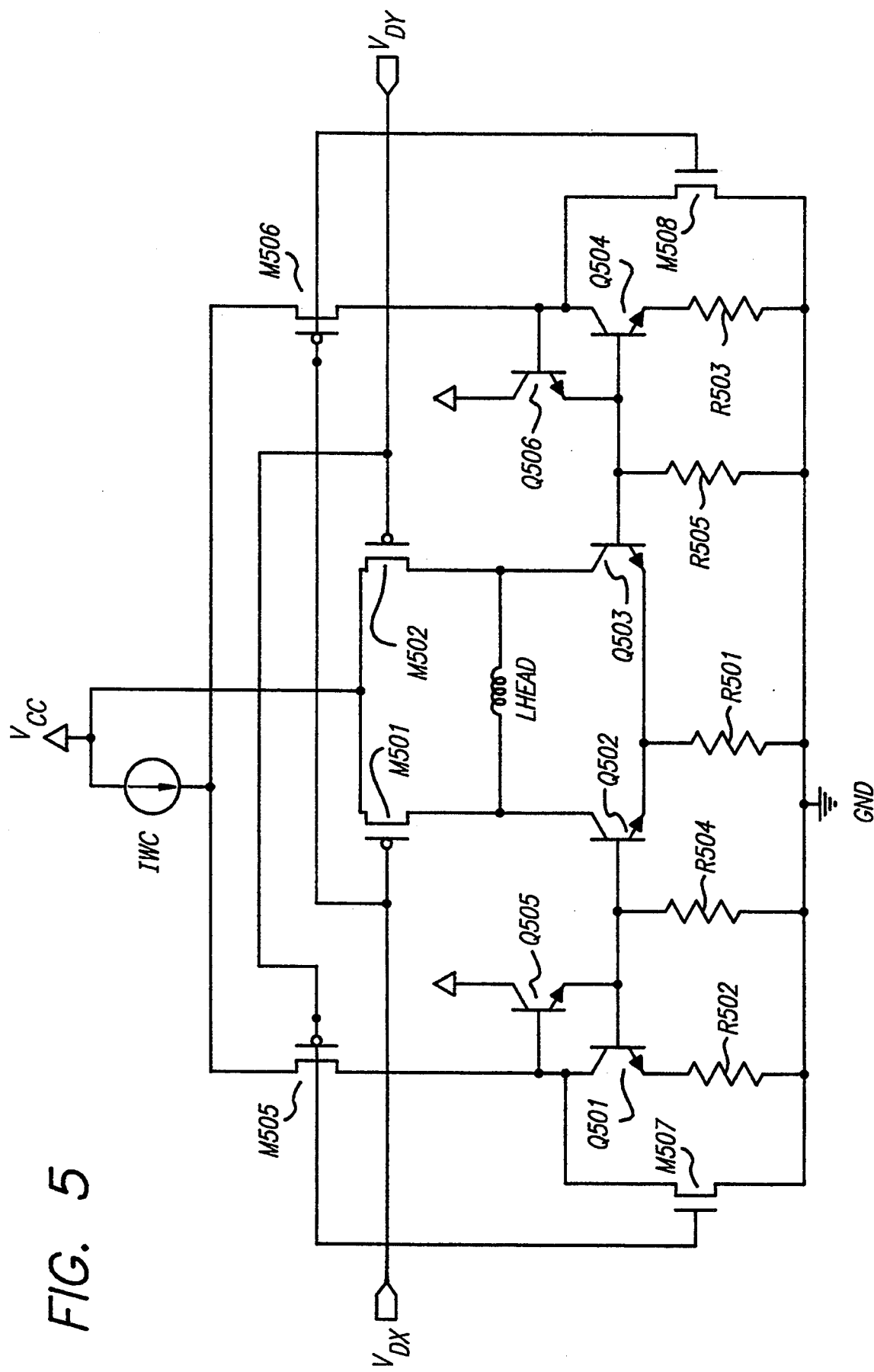
FIG. 5 is a detailed diagram of a further alternate embodiment of the present invention.

FIG. 5 is a detailed diagram illustrating a further alternate embodiment of the present invention comprising PMOS FETs M501–M502 and M505–M506, NMOS FETs M507–M508, NPN transistors Q501–Q506, inductive load $L_{HEAD}$, and constant current source $I_{WC}$. Transistors Q502 and Q503 are coupled in parallel having a common emitter that is coupled to a first terminal of resistor R501. The second terminal of resistor R501 is coupled to ground. The collector of transistor Q502 is coupled to the drain of PMOS FET M501 and to a first terminal of inductive load, $L_{HEAD}$. Similarly, the collector of transistor Q503 is coupled to the drain of PMOS FET M502 and to a second terminal of inductive load, $L_{HEAD}$. PMOS FETs M501–M502 are coupled in parallel having a common source coupled to supply voltage $V_{CC}$.

Voltage supply $V_{CC}$ is coupled to a first terminal of constant current source $I_{WC}$ and to the collectors of NPN transistors Q505 and Q506. The second terminal of constant current source $I_{WC}$ is coupled to the sources of PMOS FETs M505 and M506. The drains of PMOS FETs M505 and M506 are coupled to the collectors of NPN transistors Q501 and Q504, respectively, and to the bases of NPN transistors Q505 and Q506, respectively. Resistors R502 and R503 are coupled between ground and the emitters of transistors Q501 and Q504, respectively. The emitter of transistor Q505 is coupled to the bases of transistors Q501 and Q502, and to the first terminal of resistor R504. The second terminal of resistor R504 is coupled to ground. Similarly, the emitter of transistor Q506 is coupled to the bases of transistors Q503 and Q504, and to the first terminal of resistor R505. The second terminal of resistor R505 is coupled to ground.

Input signal $V_{DX}$ is provided to the gates of PMOS FETs M501 and M506 and to the gate of NMOS FET M508. Input signal $V_{DY}$ is provided to the gates of PMOS FETs M502 and M505 and to the gate of NMOS FET M507.

When input voltage $V_{DX}$ is high and $V_{DY}$ is low, PMOS FETs M501 and M506 as well as NMOS FET M507 are turned off, while PMOS FETs M502 and M505 as well as NMOS FET M508 are turned on. Constant current source $I_{WC}$ is blocked from flowing to NPN transistors Q504 and Q506 by PMOS FET M506 that is turned off. Also, the voltage at the base of transistor Q506 is pulled to ground by NMOS FET M508 that is on. NPN transistor Q503 is thereby turned off. However, constant current source $I_{WC}$ is provided to NPN transistors Q501 and Q505 by PMOS FET M505 that is turned on. Also, NMOS FET M507 is off, thus the voltage at the base of transistor Q505 is not pulled to ground.

NPN transistor Q502 is thereby turned on, and provides a current proportional to $I_{WC}$. PMOS FET M502 is turned on due to $V_{DY}$ whereas FET M501 is off, therefore a current proportional to constant current $I_{WC}$ flows from PMOS FET M502 through inductive load, $L_{HEAD}$. Thus, current mirror Q501–Q502 is active and sinks a current through the inductive load.

When input voltage $V_{DY}$ is high and $V_{DX}$ is low, PMOS FETs M502 and M505 as well as NMOS FET M508 are turned off, while PMOS FETs M501 and M506 as well as NMOS FET M507 are turned on. Constant current source $I_{WC}$ is blocked from flowing to NPN transistors Q501 and Q505 by PMOS FET M505 that is turned off. Also, the voltage at the base of transistor Q505 is pulled to ground by NMOS FET M507 that is on. NPN transistor Q502 is thereby turned off. However, constant current source $I_{WC}$ is provided to NPN transistors Q504 and Q506 by PMOS FET M506 that is turned on. Also, NMOS FET M508 is off, thus the voltage at the base of transistor Q506 is not pulled to ground.

NPN transistor Q503 is thereby turned on, and provides a current proportional to $I_{WC}$. PMOS FET M501 is turned on due to $V_{DY}$ whereas FET M502 is off, therefore a current proportional to constant current $I_{WC}$ flows from PMOS FET M501 through inductive load, $L_{HEAD}$. Thus, current mirror Q503–Q504 is active and sinks a current through the inductive load.

In FIG. 5, the head voltage swing is determined using Kirchhoff's voltage law along a current path of the write driver. The peak swing voltage across the write head is described by Equation (3), as shown above. Thus, this embodiment provides read/write mechanisms operating at 3.3 V with same performance as devices operated with 5 V and 12 V voltage supplies.

Figure 6:
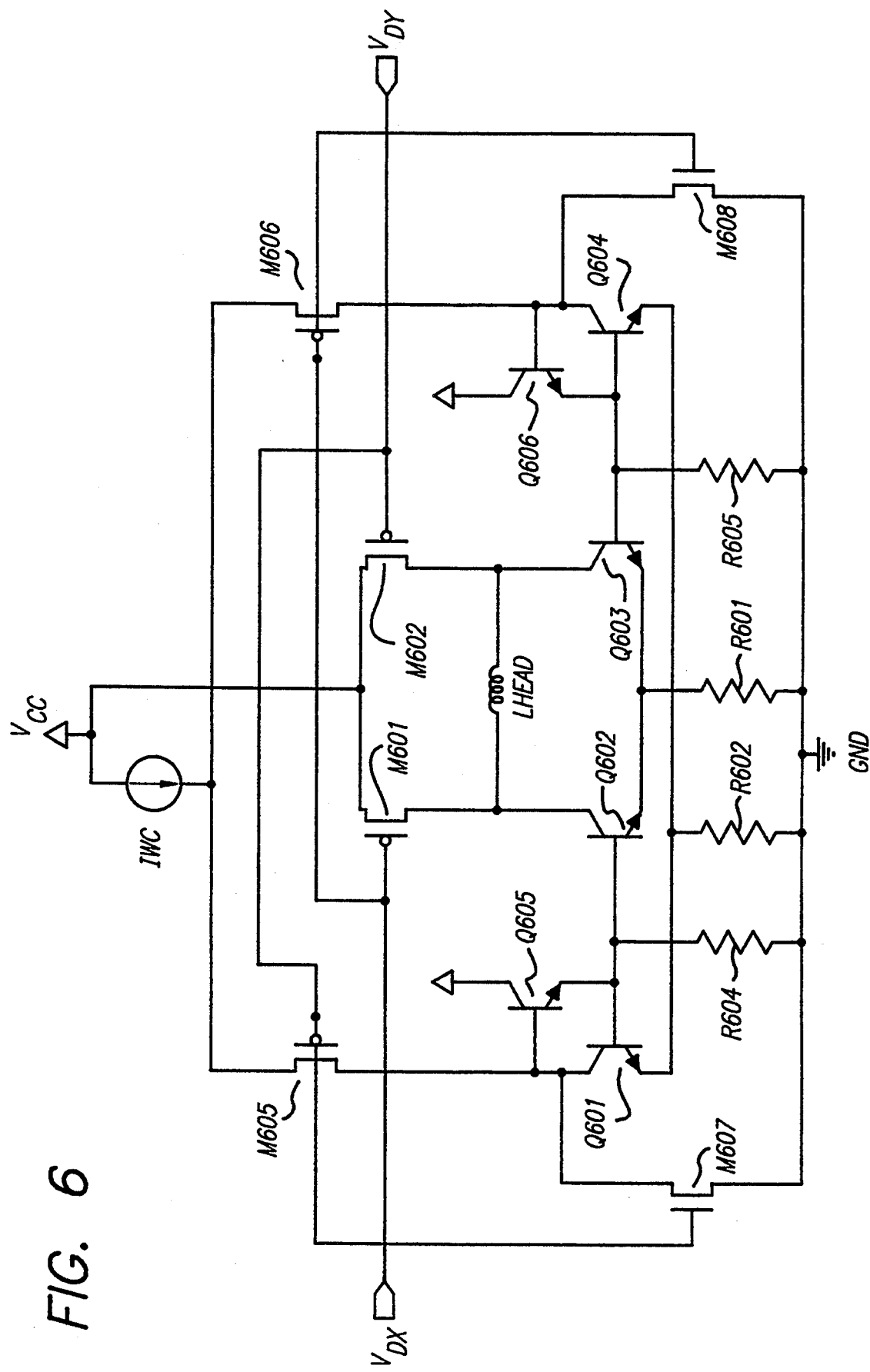
FIG. 6 is a detailed diagram of yet another alternate embodiment of the present invention.

FIG. 6 is yet another embodiment of the present invention. The circuit of FIG. 6 is similar to the circuit of FIG. 5. Like elements of the circuit shown in FIG. 6 that are found in the circuit of FIG. 5 are relabelled to have the integer 6 as the first numeral of a label. The only exceptions are resistors R502 and R503 of FIG. 5 that are replaced by a single resistance R602 in FIG. 6. Thus, the emitters of NPN transistors Q601 and Q604 are coupled together to the first terminal of resistance R602. The second terminal of resistance R602 is coupled to ground. Like the embodiment shown in FIG. 5, the peak swing voltage across the write head of the circuit shown in FIG. 6 is described by Equation (3), as shown above. Thus, this embodiment provides read/write mechanisms operating at 3.3 V with same performance as devices operated with 5 V and 12 V voltage supplies.

In this manner, a write driver that has nearly rail-to-rail head voltage swing is disclosed.

We claim:

1. A circuit for operating inductive recording heads comprising:
   an inductive recording means for magnetically recording data;
   first write driver means comprising first and second FETs, said inductive recording means coupled between first and second outputs of said first write driver means, said first and second outputs of said first write driver means being selectably enabled by first and second input signals;
   second write driver means having first and second inputs coupled to said first and second outputs of said first write driver means, respectively, said second write driver means comprising first and second current mirrors;
   first and second bandgap current sources coupled to said second write driver means; and, switching means coupled to said first and second bandgap current sources and to said second write driver means, said first and second input signals provided to said switching means for selectably sinking current through said first and second inputs of said second write driver means.

2. The circuit of claim 1 wherein said first and second input signals are CMOS level signals.

3. The circuit of claim 1 wherein when said first input signal is greater than said second input signal, a current path is enabled comprising said inductive recording means, said second output of said first write driver means, and said first input of said second write driver means.

4. The circuit of claim 1 wherein when said second input signal is greater than said first input signal, a current path is enabled comprising said inductive recording means, said first output of said first write driver means, and said second input of said second write driver means.

5. The circuit of claim 1 wherein said switching means comprises first and second Schottky NPN transistors for selectably coupling said first and second bandgap current sources to said second write driver means, respectively.

6. The circuit of claim 1 wherein said second write driver means comprise said first and second current mirror means for selectably sinking current that is proportional to said first and second bandgap currents, respectively.

7. The circuit of claim 1 wherein said second write driver means comprises first and second FETs, a head select signal provided to said first and second FETs for enabling and disabling said second write driver means.

8. A circuit for operating inductive recording heads comprising:
   an inductive recording means for magnetically recording data;
   first write driver means comprising first and second FETs, said inductive recording means coupled between first and second outputs of said first write driver means, said first and second outputs of said first write driver means being selectably enabled by first and second input signals;
   second write driver means comprising switching means and first and second current mirror means, said second write driver means having first and second inputs coupled to said first and second outputs of said first write driver means, respectively, said first and second input signals provided to said second write driver means for selectably sinking current through said first and second inputs of said second write driver means; and
   a bandgap current source coupled to said second write driver means.

9. The circuit of claim 8 wherein said first and second input signals are CMOS level signals.

10. The circuit of claim 8 wherein when said first input signal is greater than said second input signal, a current path is enabled comprising said inductive recording means, said second output of said first write driver means, and said first input of said second write driver means.

11. The circuit of claim 8 wherein when said second input signal is greater than said first input signal, a current path is enabled comprising said inductive recording means, said first output of said first write driver means, and said second input of said second write driver means.

12. The circuit of claim 8 wherein said switching means comprises first and second FETs for selectably enabling said first and second inputs of said second write driver means, respectively.

13. The circuit of claim 8 wherein said first and second current mirror means are for selectably sinking current that is proportional to said bandgap current.

14. A circuit for operating inductive recording heads comprising:
   an inductive recording means for magnetically recording data;
   first write driver means comprising first and second FETs, said inductive recording means coupled between first and second outputs of said first write driver means;
   second write driver means comprising first and second current mirror means, said second write driver means having first and second inputs coupled to said first and second outputs of said first write driver means, respectively;
   third and fourth current mirror means coupled to said second write driver means;
   switching means coupled to said third and fourth current mirror means and to said first write driver means, said first and second input signals provided to said switching means for selectably sinking current through said first and second inputs of said second write driver means and for selectably enabling said first and second outputs of said first write driver means; and,
   a bandgap current source coupled to said switching means.

15. The circuit of claim 14 wherein said first and second input signals are differential Emitter Coupled Logic (ECL) signals.

16. The circuit of claim 14 wherein when said first input signal is greater than said second input signal, a current path is enabled comprising said inductive recording means, said second output of said first write driver means, and said first input of said second write driver means.

17. The circuit of claim 14 wherein when said second input signal is greater than said first input signal, a current path is enabled comprising said inductive recording means, said first output of said first write driver means, and said second input of said second write driver means.

18. The circuit of claim 14 wherein said switching means comprises first and second Schottky NPN transistors for selectably enabling said first and second outputs of said first write driver means, respectively.

19. The circuit of claim 14 wherein said switching means comprise first and second NPN transistors for selectably enabling said third and fourth current mirror means, respectively.

20. The circuit of claim 14 wherein said first and second current mirror means are for selectably sinking current that is proportional to said bandgap current.

21. A circuit for operating inductive recording heads comprising:
   an inductive recording means for magnetically recording data;
   first write driver means comprising first and second FETs, said inductive recording means coupled between first and second outputs of said first write driver means, said first and second outputs of said first write driver means being selectably enabled by first and second input signals;

second write driver means comprising first and second current mirror means, said second write driver means having first and second inputs coupled to said first and second outputs of said first write driver means, respectively;

switching means coupled to said second write driver means, said first and second input signals provided to said switching means for selectably sinking current through said first and second inputs of said second write driver means; and, a bandgap current source coupled to said second write driver means.

22. The circuit of claim 21 wherein said first and second input signals are CMOS level signals.

23. The circuit of claim 21 wherein when said first input signal is greater than said second input signal, a current path is enabled comprising said inductive recording means, said second output of said first write driver means, and said first input of said second write driver means.

24. The circuit of claim 21 wherein when said second input signal is greater than said first input signal, a current path is enabled comprising said inductive recording means, said first output of said first write driver means, and said second input of said second write driver means.

25. The circuit of claim 21 wherein said switching means comprises first and second FETs for selectably coupling said bandgap current source to said second write driver means.

26. The circuit of claim 21 wherein said first and second current mirror means are for selectably sinking current that is proportional to said bandgap current.

27. The circuit of claim 26 wherein said switching means comprises third and fourth FETs for selectably disabling said first and second current mirror means.

28. The circuit of claim 26 wherein the inputs of said first and second current mirror means share a resistance.

* * * * *